United States Patent [19]

McClure

[11] Patent Number: 5,305,268
[45] Date of Patent: Apr. 19, 1994

[54] SEMICONDUCTOR MEMORY WITH COLUMN EQUILIBRATE ON CHANGE OF DATA DURING A WRITE CYCLE

[75] Inventor: David C. McClure, Carrollton, Tex.

[73] Assignee: SGS-Thomson Microelectronics, Inc., Carrollton, Tex.

[21] Appl. No.: 627,049

[22] Filed: Dec. 13, 1990

[51] Int. Cl.$^5$ .............................. G11C 7/00
[52] U.S. Cl. ...................... 365/203; 365/191
[58] Field of Search ................ 365/203, 191

[56]  References Cited

U.S. PATENT DOCUMENTS

| | | | |
|---|---|---|---|
| 4,592,026 | 5/1986 | Matsukawa et al. | 365/203 |
| 4,592,028 | 5/1986 | Konishi | 365/233.5 |
| 4,612,631 | 9/1986 | Ochii | 365/203 |
| 4,658,381 | 4/1987 | Reed et al. | 365/203 |
| 4,744,063 | 5/1988 | Ohtani et al. | 365/203 |
| 4,802,129 | 1/1989 | Hoekstra et al. | 365/203 |
| 4,825,413 | 4/1989 | Tran | 365/189.06 |
| 4,862,421 | 8/1989 | Tran | 365/189.07 |
| 4,866,674 | 9/1989 | Tran | 365/203 |
| 4,893,033 | 1/1990 | Itano et al. | 307/465 |
| 4,939,693 | 7/1990 | Tran | 365/190 |
| 5,029,135 | 7/1991 | Okubo | 365/203 |
| 5,040,152 | 8/1991 | Voss et al. | 365/230.03 |
| 5,047,984 | 9/1991 | Monden | 365/191 |
| 5,068,831 | 11/1991 | Hoshi et al. | 365/203 |
| 5,091,889 | 2/1992 | Hamano et al. | 365/203 |
| 5,121,356 | 6/1992 | Park et al. | 365/203 |

OTHER PUBLICATIONS

Tran, et al., "An 8-ns 256K ECl SRAM with CMOS Memory Array and Battery Backup Capability", J. Solid State Circuits, vol. 23, No. 5 (IEEE, Oct. 1988), pp. 1041-1047.

Tran, et al., "An 8ns BiCMOS 1Mb ECL SRAM with a Configurable Memory Array Size", *Digest of Technical Papers*, 1989 IEEE International Solid-State Circuits Conference (IEEE, Feb. 1989), pp. 36-37.

Minato, et al., "A 20 ns 64K CMOS SRAM", *Digest of Technical Papers*, Feb. 1984 IEEE International Solid-State Circuits Conference, (IEEE, 1984), pp. 222-223.

*Primary Examiner*—Eugene R. LaRoche
*Assistant Examiner*—Michael C. Kessell
*Attorney, Agent, or Firm*—Rodney M. Anderson; Lisa K. Jorgenson; Richard K. Robinson

[57]  ABSTRACT

A static random-access memory is disclosed which utilizes bit line pairs for each column of memory cells for communication of data between external data terminals and the memory cells. A precharge transistor is connected between each bit line and a precharge voltage, for example $V_{cc}$, and an equilibration transistor is connected between the bit lines in each bit line pair. The precharge and equilibration transistors are controlled according to selection of the column, so that all columns which are not selected by the column address are precharged and equilibrated, including the unselected columns in the same sub-array as the selected columns. In an additional embodiment of the invention, a data transition detection circuit also controls the precharge and equilibration transistors, so that the precharge and equilibration transistors for the selected columns are turned on responsive to an input data transition during a write operation; this assists the write drivers in more quickly writing the new data onto the bit lines.

18 Claims, 6 Drawing Sheets

SEMICONDUCTOR MEMORY WITH COLUMN EQUILIBRATE ON CHANGE OF DATA DURING A WRITE CYCLE

This invention is in the field of semiconductor memory circuits, and is particularly directed to the column architecture of such circuits.

This application is related to my applications Ser. No. 07/627050 and Ser. No. 07/627059, both filed contemporaneously herewith and assigned to SGS-Thomson Microelectronics, Inc.

BACKGROUND OF THE INVENTION

Conventional memory circuits which utilize static memory cells, such circuits including static random access memories (SRAMs), FIFOs, dual-port memories, and microprocessors and other logic devices with such memory embedded therein, are generally organized in rows and columns. In these conventional memories, a row select line, generally decoded from a row address value, connects each of a number of memory cells associated with the row address value to a pair of bit lines; each pair of bit lines are associated with a column of memory cells. During a read operation, the bit line pair communicates, to a sense amplifier or other output circuitry, a differential signal corresponding to the data state stored in the memory cell in its associated column which is also in the selected row. Conversely, during a write operation, the bit line pair communicates a differential signal from input circuitry to the memory cell in its associated column which is in the selected row.

An important factor in the performance of a particular memory circuit is the speed at which such read and write operations can be reliably performed. The reliability of such operations is improved where the differential signal communicated by the bit lines is as large as possible. For a read operation, the sense amplifier or other circuit can more accurately read the data state where the differential voltage between the bit lines is large. Especially where the memory cells are fabricated conventionally as cross-coupled inverters with resistive loads (the value of the resistors in the loads being as high as possible, for example on the order of Teraohms), noise immunity of the cell is improved by presentation of a large differential voltage on the bit lines during the write operation. Accordingly, the voltage swing of the bit lines in such memories is preferably as large as possible, occurring in as short a time as possible.

Conventional techniques for controlling the bit lines of such memory circuits to quickly accomplish voltage swings thereon include the precharging and equilibration (also referred to as equalization) of each bit line pair to a known voltage prior to each operation. The precharging and equilibration in such conventional techniques is performed by a clocked signal, which causes the precharge and equilibration for all bit lines at the same time, as described in as described in Minato, et al., "A 20 ns 64K CMOS SRAM", *Digest of Technical Papers*, 1984 *IEEE International Solid-State Circuits Conference* (IEEE, 1984), pp. 222-23. In this way, the bit lines will not have to make a full transition from one differential state to the other in successive cycles, significantly improving the performance of the circuit. Conventionally, the bit lines are precharged to a high voltage, such as the $_{cc}$ supply, and a transistor connected between the two bit lines in each pair is turned on to equilibrate the two bit lines, ensuring that they are precharged to the same voltage.

For a read operation in a static memory circuit as described hereinabove, it is desirable to precharge and equilibrate the bit lines to $V_{cc}$, and then release the bit lines to respond to the memory cell in the selected row. The memory cell in the selected row will present a differential signal on the bit lines in the bit line pair, to communicate its stored data state. Release of the bit lines after precharge and equilibration allows the selected memory cell to establish this differential voltage without opposition from the precharge and equilibration of the bit lines. A conventional write operation is performed by a write circuit discharging one of the precharged bit lines in the bit line pair to ground. This is also preferably done after release of the precharge and equilibration of the bit lines, so that the write circuit also does not have to discharge a bit line in opposition to a static load attempting to pull the discharging bit line toward the precharge voltage.

An important write cycle timing parameter, particularly for static RAMs, is the time that valid input data must be present prior to the end of the write enable pulse; this parameter is commonly referred to as the data setup time. This timing parameter commonly affects the performance of the system incorporating the memories, as the data bus connected to the inputs of the memories will often not only carry input data thereto but will also carry data from the memories, or communicate data between other circuits in the system. As a result, system performance and flexibility is improved with short data setup times for the memory devices.

However, in many memories such as conventional SRAMs, significant parasitic resistance and capacitance may exist in the write paths between the external terminals of the device and the columns to which data is to be written. The effect of the parasitic impedance is, of course, to delay switching of nodes responsive to data applied thereto, such switching occurring as a result of change of data at the external terminals of the device. Since the write operation is controlled by the end of the write enable pulse, valid input data must be present at all necessary internal nodes at such time as the end of the write enable pulse is communicated internally. Parasitic impedance in the write path thus affects the important parameter of data setup time, since the data setup time specification must account for the internal delay caused by parasitic impedance in the write path.

It is therefore an object of this invention to provide a circuit which reduces the data setup time during a write operation.

It is a further object of this invention to provide such a circuit which allows for late change of input data in a write operation.

It is a further object of this invention to provide such a circuit which operates in cooperation with column precharge and equilibration control in the memory.

Other objects and advantages will be apparent to those of ordinary skill in the art having reference to the following specification together with the drawings.

SUMMARY OF THE INVENTION

The invention may be incorporated into a memory circuit by providing a precharge and equilibrate signal to columns in the memory responsive to detection of a transition of input data during a write operation. This signal can be generated by a data transition detection circuit, constructed similarly as an address transition detection circuit. The output of the data transition detection circuit is communicated to the precharge and equilibration transistors for each column in the memory not already in precharge. Precharge and equilibration of the bit lines will speed up the communication of input data of opposite data state during a write operation, reducing the data setup time necessary to safely accomplish the write.

DETAILED DESCRIPTION OF THE PREFERRED EMBODIMENTS

Figure 1:
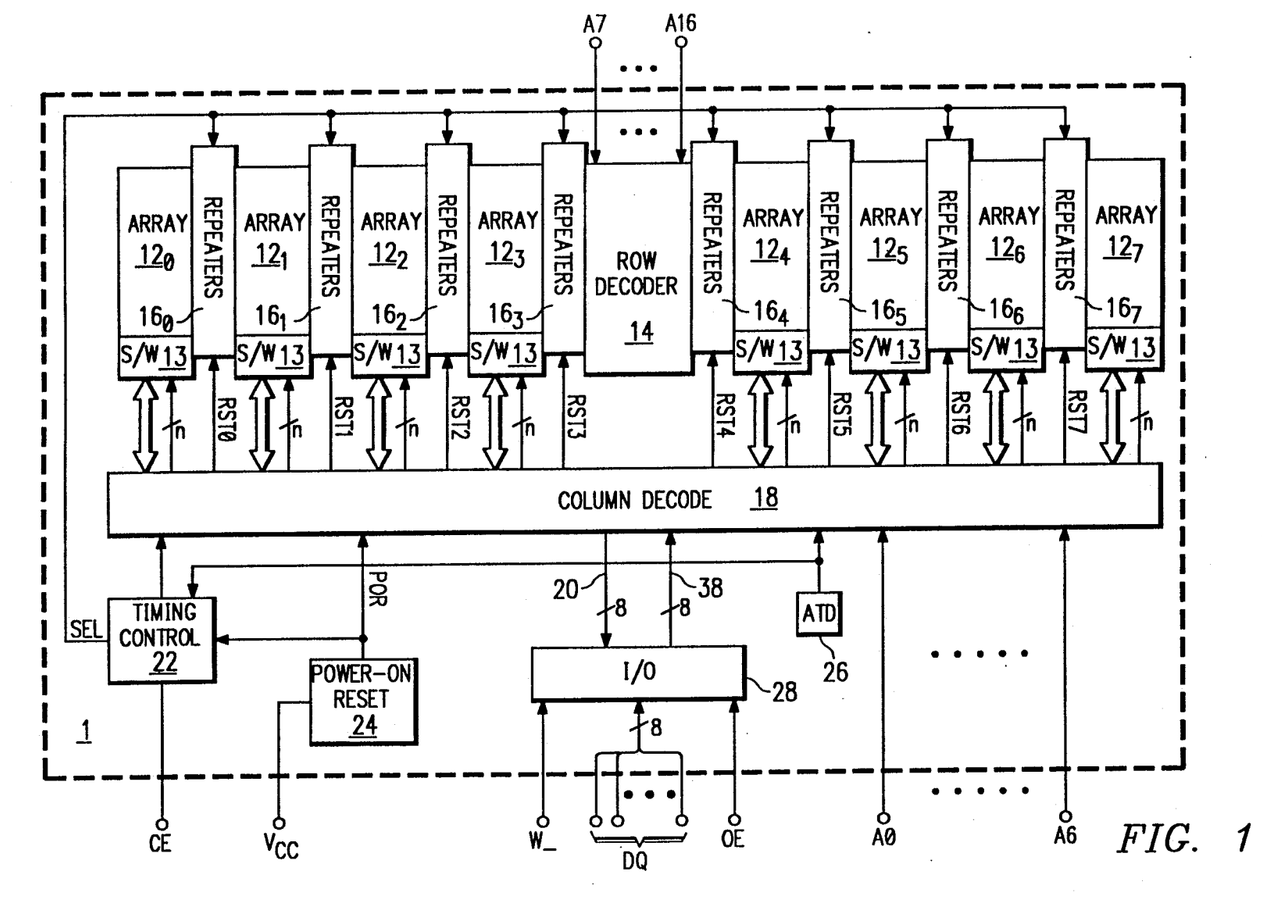
FIG. 1 is an electrical diagram, in block form, of a static memory incorporating a first embodiment of the invention.

Referring now to FIG. 1, a block diagram of an integrated circuit memory 1 incorporating the preferred embodiment of the invention described herein will be described Memory 1 is an integrated circuit memory, for example a static random access memory (SRAM), having $2^{20}$, or 1,048,576, storage locations or bits. Memory 1 in this example is a wide-word memory, organized as $2^{17}$, or 128 k, addressable locations of eight bits each. Accordingly, for example in a read operation, upon the access of one of the memory locations, eight data bits will appear at the eight input/output terminals DQ. The electrical organization of memory 1, in this example, is 1024 rows of 1024 columns, with eight columns accessed in each normal memory operation.

In this example of memory 1, the memory array is divided into eight sub-arrays $12_0$ through $12_7$, each of which have 1024 rows and 128 columns. Memory 1 includes seventeen address terminals A0 through A16, for receiving the seventeen address bits required to specify a unique memory address. In the conventional manner, the signals from these seventeen address terminals are buffered by address buffers (not shown). After such buffering, signals corresponding to ten of the address terminals (A7 through A16) are received by row decoder 14, for selecting the one of the 1024 rows to be energized by row decoder 14.

FIG. 1 illustrates schematically the relative physical location of sub-arrays 12 relative to one another, and relative to row decoder 14. As will be described in further detail hereinbelow, the selection of a row of memory cells in sub-arrays 12 is accomplished by row lines, one of which is driven from row decoder 14 according to the value of the row address at terminals A7 through A16. In an arrangement such as shown in FIG. 1 where row decoder 14 is located centrally, with sub-arrays 12 on either side thereof, it is preferred that the most significant column address bit (address terminal A6 in this embodiment) also be decoded by row decoder 14, so that the row line may be energized only on one side of the centrally located row decoder 14, according to this most significant column address bit. The energizing of a row line connects the contents of memory cells to their corresponding bit lines in the conventional manner. Sense/write circuits 13 are provided for sensing and storing the data state on the bit lines in sub-arrays 12, for communicating externally presented input data to the selected memory cells. It should be noted that many conventional arrangements and organization of sense/write circuits 13 may be utilized in memory 1 according to the invention, such arrangements including the assignment of one sense amplifier for each bit line pair, or the assignment of one sense amplifier for multiple bit line pairs, with the selection of which bit line pair is to be sensed made by column decoder 18 according to the column address. In addition, separate write paths and write circuits may also be provided.

For purposes of reducing the power consumed during active operation, in this embodiment only one of the sub-arrays 12 remains energized during each active cycle, with the selection of the sub-array 12 which remains energized determined by the desired memory address (i.e., three bits of the column address). This is done by repeaters 16, which are provided between sub-arrays 12, and also between row decoder 14 and sub-arrays $12_3$ and $12_4$. Repeaters 16 pass along the energized state of the selected row line, latch the energized state of the selected row line for the selected sub-array 12, and de-energize the row line for sub-arrays 12 which are not selected. This arrangement requires that all eight bits of the accessed memory location are located in the same sub-array 12.

It should be noted that, for purposes of this invention, it is not essential or necessary that the eight bits of the accessed memory location must be located in the same sub-array 12, or that latched repeaters 16 be provided between sub-arrays 12. As described in my copending application Ser. No. 588,577, filed Sep. 26, 1990 and assigned to SGS-Thomson Microelectronics, Inc., however, such organization is preferred as it provides for reduced active power dissipation without the disadvantages attendant with time-out of the word lines or of multiple metal level implementations.

Signals corresponding to the remaining seven address terminals (A0 through A6) are received by column decoder 18 to control repeaters 14 to maintain selection of one of sub-arrays 12 by way of lines RST0 through RST7. Column decoder 18 also selects the desired columns in the selected sub-array 12 responsive to the remainder of the column address value, in the conventional manner. While single lines are indicated for the communication of the address value to row decoder 14 and column decoder 18, it should be noted that, as in many conventional memories, both true and complement values of each address bit may alternatively be communicated from the address buffers to the decoders, for ease of decoding.

Further included in memory 1 according to this embodiment of the invention, is input/output circuitry 28, which is in communication with column decoder 18 via an eight-bit output bus 20 and an eight-bit input bus 38, and which is also in communication with input/output terminals DQ, with write enable terminal W—, and with output enable terminal OE. Input/output circuitry 28 includes conventional circuitry for providing and controlling communication between input/output terminals DQ and the memory cells selected according to the address value presented to memory 1, and accordingly will not be described in further detail herein. It should be noted that many other alternative organizations of memory 1, relative to the input/output width, and including dedicated rather than common input/output terminals, may also utilize the present invention.

Memory 1 further includes timing control circuitry 22, which controls the operation of various portions of memory 1 during a memory cycle in the conventional manner. It should be noted that timing control circuitry 22 is generally not a particular block of circuitry, as suggested by FIG. 1, but generally is distributed within memory 1 to control the operation of various portions therein. Timing control circuitry 22 receives, for example, signals from terminal CE which enables and disables the operation of memory 1. As shown in FIG. 1, line SEL from timing control circuitry 22 is connected to repeaters 16, for control thereof as described in said copending application Ser. No. 588,577.

It should also be noted that, for some static memories, timing control circuitry 22, and other circuit blocks such as column decoder, respond according to a address transition detection circuit 26 to control the operation of memory 1 dynamically, in response to transitions at address terminals A0 through A16. Copending application Ser. No. 601,287, filed Oct. 22, 1990 and assigned to SGS-Thomson Microelectronics, Inc., incorporated herein by this reference, describes an address transition detection circuit as may be used as address transition detection circuit 24, and its application to the buffering of the address signals received at address terminals A0 through A16. It should be noted that such control according to address transition detection is preferred in this embodiment of the invention to control the precharge and equilibration of the bit lines as will be described hereinbelow. It should also be noted that use of address transition detection to control repeaters 16 performed dynamically within a cycle, as described in said copending application Ser. No. 588,577, is also preferred.

Memory 1 further includes a power-on reset circuit 24. Power-on reset circuit 24 receives bias voltage from power supply terminal $V_{cc}$ (as of course do other portions of memory 1 by connections not shown), and generates a signal on line POR indicating that the $V_{cc}$ power supply has reached a sufficient level upon memory 1 initially powering up, to prevent portions of memory 1 from powering-up in an indeterminate, or undesired, state. As will be described hereinbelow, and as described in copending application Ser. No. 569,000, filed Aug. 17, 1990, incorporated herein by this reference, said application assigned to SGS-Thomson Microelectronics, Inc., power-on reset circuit 24 may similarly also control other portions of memory 1, as suggested by the connection of line POR to timing control circuitry 22 in FIG. 1. Said copending application Ser. No. 569,000 also describes preferred configurations of power-on reset circuit 24, although for purposes of this invention conventional power-on reset circuits may also be used.

As noted above, for purposes of reducing power consumption, memory 1 according to this embodiment energizes only one of the eight sub-arrays 12, selected according to the three most significant column address bits. In this embodiment, repeaters 16 are present between sub-arrays 12, and also between row decoder 14 and each of sub-arrays $12_3$ and $12_4$, for maintaining the application of the energized row line within the selected sub-array 12 and, after a period of time, de-energizing the row line in the other sub-arrays 12. In this way, the column address (particularly the three most significant bits) controls the application of the word line so that only that portion of the word line in the selected sub-array 12 is energized for the entire memory operation cycle. Column decoder 18 also selects eight of the 128 columns in the selected sub-array 12, according to the value of the remaining bits of the column address. In this embodiment, also for purposes of reducing active power consumption, only those sense/write circuits 13 in the selected sub-array 12 which are associated with the desired memory bits are energized. Sense/write circuits 13 so selected by column decoder 18 are then placed in communication with input/output circuitry 28 via bus 20 or bus 38, as the case may be, through which the reading of data from or writing of data to the selected memory cells may be done in the conventional manner. Said copending application Ser. No. 588,577, incorporated herein by this reference, provides a detailed description of the construction and operation of repeaters 16.

Of course, many alternative organizations of memory 1 may be used in conjunction with the invention described herein. Examples of such organizations would include by-one memories, where a single bit is input to or output from in normal operation. In addition, wide-word memories where each sub-array is associated with one of the input/output terminals, and memories where the entire array is energized during normal operation, may alternatively be used. As mentioned hereinabove, of course, other memory types such as dynamic RAMs, EPROMs, embedded memories, dual-port RAMs, FIFOs, and the like, each with organization of their own, may also benefit from this invention.

It should also be noted that other physical and electrical arrangements of the sub-arrays 12 may be alternatively be used with the present invention. For example, two row decoders 14 may be incorporated into memory 1, each of which controls the application of a row line signal into half of the memory. Row decoder or decoders 14 may also be located along one edge of its associated sub-arrays 12, rather than in the middle thereof as shown in FIG. 1. It is contemplated that the particular layout of memory 1 will be determined by one of ordinary skill in the art according to the particular parameters of interest for the specific memory design and manufacturing processes.

Figure 2:
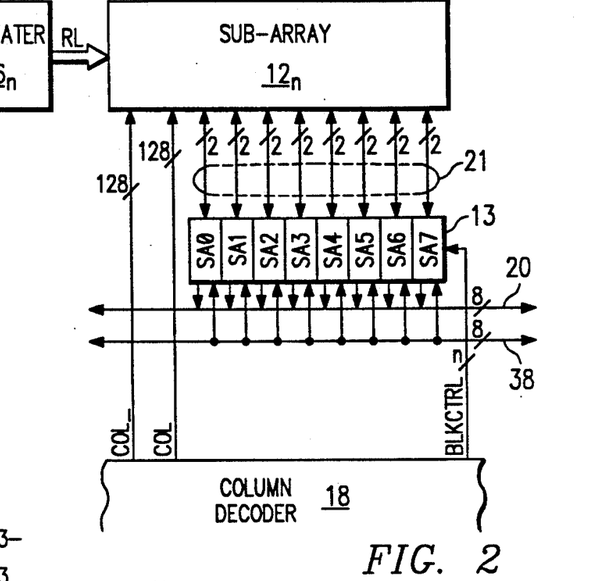
FIG. 2 is an electrical diagram, in block form, of a sub-array of the memory of FIG. 1 according to the first embodiment of the invention.

Referring now to FIG. 2, the column architecture for one of sub-arrays 12 will be described in further detail. Repeater $16_n$ generates row lines in bus RL to sub-array $12_n$, such row lines in bus RL numbering 1024 in this example where each of sub-arrays 12 include 1024 rows of memory cells.

As described hereinabove, all eight bits of the selected memory location in this by-eight embodiment of memory 1 are selected from the same sub-array 12, in order to reduce active power dissipation. Accordingly, referring to FIG. 2, eight sense/write circuits 13 are provided for sub-array $12_n$, each of which receive a differential signal on a pair of I/O lines 21 from a selected column in sub-array $12_n$. In this embodiment, each of sense/write circuits 13 in FIG. 2 include circuitry for sensing the data state of the bit lines connected thereto, and also for writing data to the bit lines connected thereto. Accordingly, each of sense/write circuits 13 is in communication with input/output circuitry 28 via both input data bus 38 and output data bus 20. Construction of sense/write circuits 13, including such sensing and write circuitry, will be described in further detail hereinbelow; it should be noted that, for purposes of this invention, other sense amplifier arrangements may alternatively be used, including separate write and sense circuitry. As a result of the configuration of FIG. 2, each of the columns in sub-array $12_n$ is associated with a single sense/write circuit 13, and accordingly with a single data terminal DQ. The assignment of individual sense/write circuits 13 to particular columns in a sub-array 12 may be done in any way convenient for purposes of layout. For example, the 128 columns in a sub-array 12 may be grouped into eight contiguous blocks of sixteen columns each, with each column in a block associated with the same sense/write circuit 13 and data terminal DQ; alternatively, each column in a group of eight adjacent columns may be assigned to a different sense/write circuit 13 and data terminal DQ.

Figure 3:
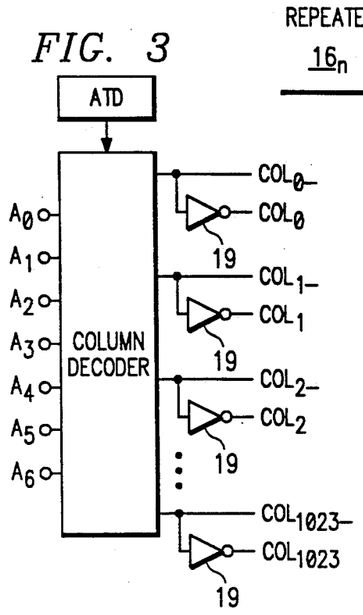
FIG. 3 is an electrical diagram, in schematic form, of the output of the column decoder in the memory of FIG. 1.

Column decoder 18, responsive to the value of the column address received at address terminals A0 through A6, presents select signals on buses COL and COL_ to sub-array 12. For sub-array $12_n$, each of buses COL and COL_ include 128 lines, as the number of columns in sub-array $12_n$ is 128; accordingly, each column n in sub-array $12_n$ will receive a select signal on a line $COL_n$ and its complement $\overline{COL_n}$. Referring to FIG. 3, the output of column decoder 18 is shown for all columns in memory 1. FIG. 3 illustrates that the column select lines COL_ are each inverted by an inverter 19, to generate 1024 true and complement lines COL and COL_, each pair associated with one of the 1024 columns in memory 1, and each contiguous group of 128 pair of lines COL and COL_ assigned to a sub-array 12.

In addition, as shown in FIG. 3, column decoder 18 also receives a signal from address transition detection circuit 26. As will be described hereinbelow in further detail, address transition detection circuit 26 presents a pulse on line ATD responsive to detection of a transition at any one of address terminals A0 through A6. In this embodiment of the invention, column decoder 18 is configured so that, responsive to the pulse on line ATD, all columns become unselected (i.e., all of lines COL_ are driven high, with all of lines COL driven low by operation of inverters 19). Such control of column decoder 18 by address detection circuit 26 serves to precharge and equilibrate all columns in all sub-arrays 12 of memory 1.

Column decoder 18 also issues certain control signals to sense/write circuits 13, such signals illustrated in FIG. 2 by bus BLKCTRL. The signals on bus BLKCTRL are generated from the three most significant column address bits A4 through A6, so that only the sense/write circuits 13 associated with the selected sub-array 12 are enabled to perform read and write operations. The signals on bus BLKCTRL are also generated in part from timing signals generated by timing and control circuitry 22, in order to control the timing of the read and write operations in the conventional manner. Certain of the signals on bus BLKCTRL will be described in further detail hereinbelow relative to the operation of sense/write circuits 13 shown in FIG. 5.

Accordingly, referring again to FIG. 2, when the column address value indicates that the selected columns reside in sub-array $12_n$, column decoder 18 will issue select signals on eight lines COL_ and COL to eight columns in sub-array $12_n$. Column decoder 18 will also issue the appropriate sense amplifier control signals on bus BLKCTRL, to cause sense/write circuits 13 to communicate with the selected bit line pairs in sub-array $12_n$ and accomplish the desired operation.

Figure 4:
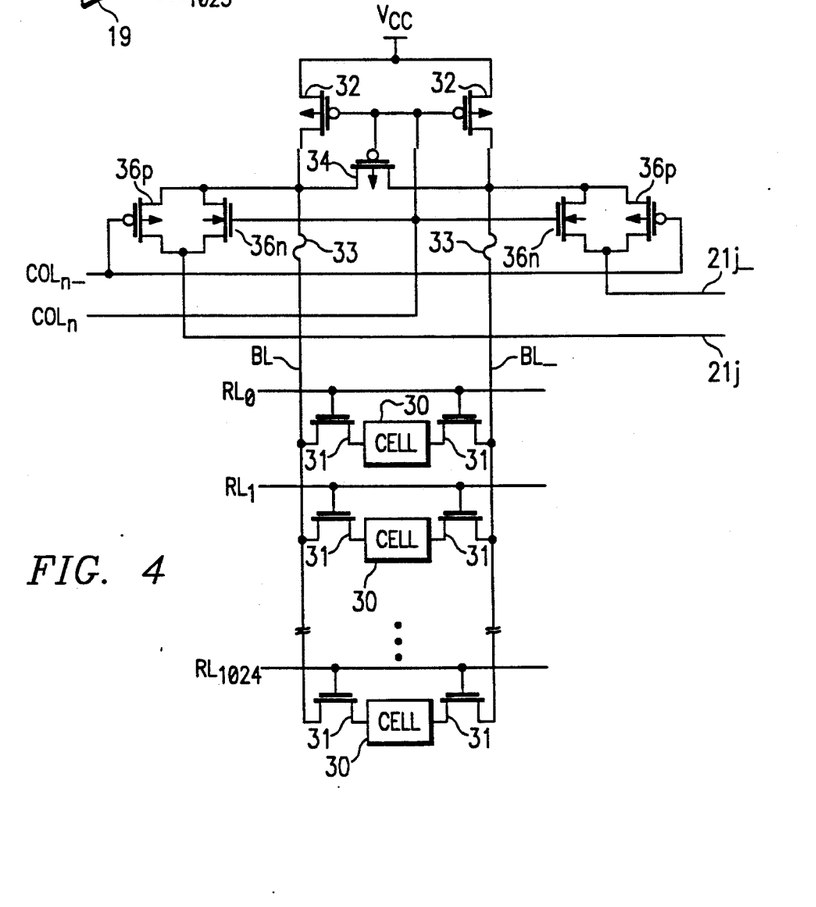
FIG. 4 is an electrical diagram, in schematic form, of a column of memory cells in the memory of FIG. 1.

Referring now to FIG. 4, the construction of a column in a sub-array 12 of memory 1 will be described. Memory cells 30, shown in block form in FIG. 4, are in this embodiment conventional static RAM cells, constructed for example of cross-coupled n-channel inverters with resistor loads. Each cell is coupled to true and complement bit lines BL and BL_ via n-channel pass transistors 31. The gates of pass transistors 31 are controlled by row lines RL; as is conventional for memory circuits, only one memory cell 30 is coupled to each pair of bit lines BL and BL_ by the operation of a row line RL. Since as described above there are 1024 rows in each sub-array 12, 1024 memory cells 30 are present in each column, each of which are selectable via row lines $RL_0$ through $RL_{1023}$, as shown in FIG. 4.

Bit lines BL and BL_ are each connected to the drain of a p-channel transistor 32; the sources of transistors 32 are connected to a precharge voltage, which in this case is $V_{cc}$, and the gates of transistors 32 are controlled by line $COL_n$ from column decoder 18. Transistors 32 thus precharge bit lines BL and BL_ when line $COL_n$ from column decoder 18 is at a low logic level, indicating that the column is not selected. P-channel equilibration transistor 34 has its source-to-drain path connected between bit lines BL and BL_, and its gate connected to line $COL_n$ from column decoder 18, so that during such time as line $COL_n$ is low (i.e., during precharge via transistors 32), bit lines BL and BL_ are equilibrated to the same potential, which in this case is $V_{cc}$.

It should be noted that, according to this embodiment of the invention, the signal on line $COL_n$ which enables precharge and equilibration of column n in memory 1 is decoded from the column address value (i.e., it is the logical complement of select line $COL_{n\_}$). Therefore, during such time as column n is not selected, its bit lines BL and BL_ are being precharged and equilibrated to one another. For memory 1 of FIG. 1, this means that all columns in sub-arrays 12 which do not contain the selected columns, and all non-selected columns in the selected sub-array 12 (in this case, all but eight columns) are in their precharge and equilibration state. The advantages of this decoded precharge and equilibrate will be explained in further detail hereinbelow.

Each of bit lines BL and BL_ are also connected to pass gates 36, each pass gate 36 including a p-channel transistor 36p and an n-channel transistor 36n having their source-to-drain paths connected in parallel. Input-/output lines $21_j$ and $21_{j\_}$ are connected on the other sides of pass gates 36 from bit lines BL and BL_, respectively. The gates of transistors 36n are connected to line $COL_n$ and the gates of transistors 36p are connected to line COL$_{n-}$; accordingly, transistors 36$n$ and 36$p$ for a column are on when the column is selected (line COL$_n$ being high and line COL$_{n-}$ being low), and transistors 36$n$ and 36$p$ for a column are off when the column is not selected (line COL$_n$ being low and line COL$_{n-}$ being high). Pass gates 36 thus communicate the state of bit lines BL and BL__ to input/output lines 21$_j$ 21$_{j-}$, and respectively, when the column is selected as indicated on lines COL$_n$ and COL$_{n-}$. The column of FIG. 4 is associated with the jth of sense/write circuits 13, as indicated by input/output lines 21$_j$ and 21$_{j-}$. It should be noted that each of the columns in sub-array 12$_n$ which are associated with the jth sense amplifier 13 will also have their pass gates 36 connected to input-/output lines 21$_j$ and 21$_{j-}$; since only one of these columns will be selected by column decoder 18 for a given column address value, there will be no bus conflict on input/output lines 21$_j$ and 21$_{j-}$, as the unselected columns will have their pass gates 36 in the off state.

Fuses 33 are also provided in this embodiment of the invention, connected in series with bit lines BL and BL__ at a point between that where the first of memory cells 30 are connectable to the bit lines BL and BL__, and the common node of pass gate 36, precharge transistors 32, and equilibration transistor 34. As will be noted hereinbelow, the construction and control of the column in this embodiment of the invention provides for efficient and effective removal of a failing column from the remainder of the memory merely by opening the two fuses 33.

Figure 5:
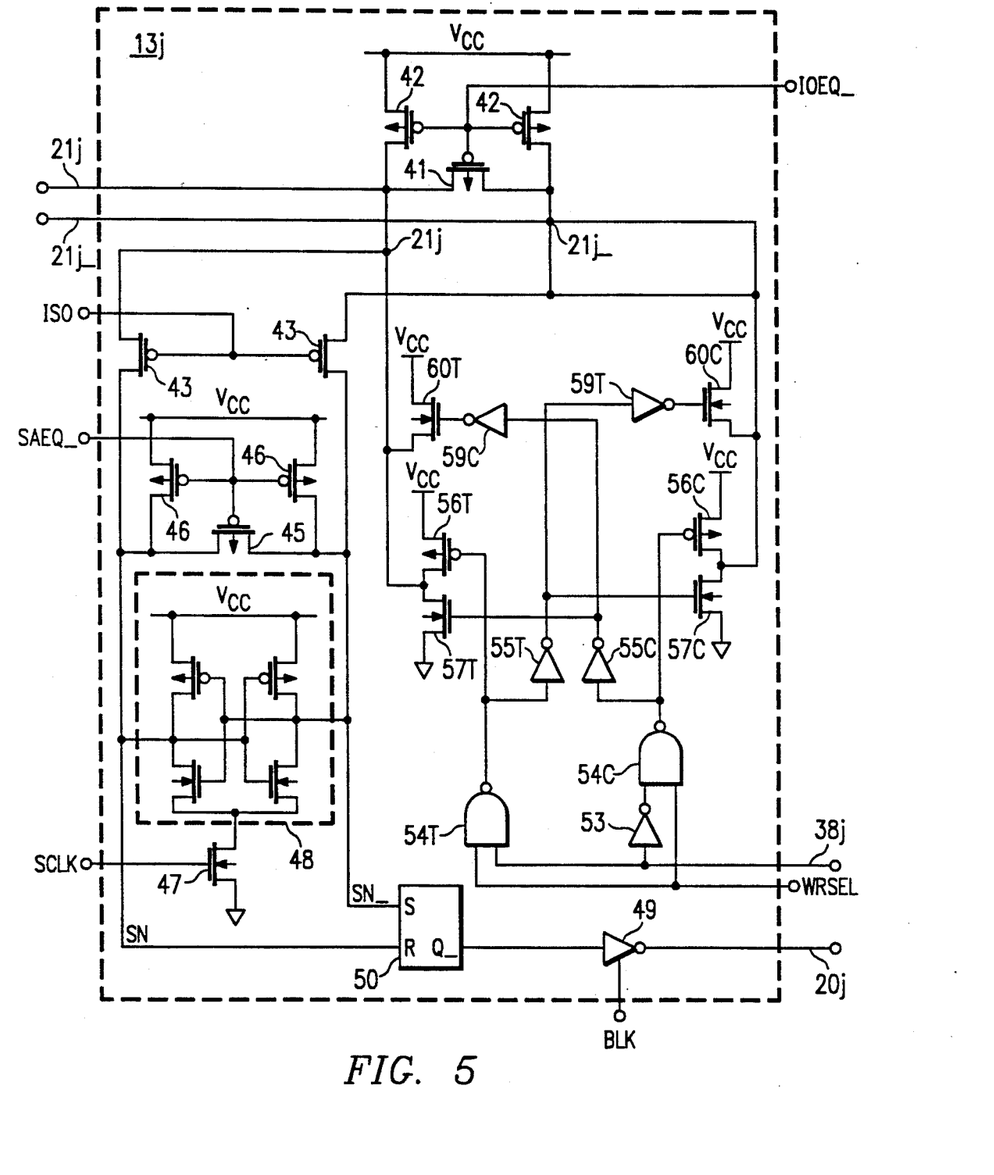
FIG. 5 is an electrical diagram, in schematic form, of a sense amplifier and write circuit as used in the memory according to the first embodiment of the invention.

Referring now to FIG. 5, the construction of sense/write circuit 13, including both read and write paths, will now be described. Complementary input/output lines 21$_j$ and 21$_{j-}$ are each connected to the drain of a p-channel precharge transistor 42; the sources of transistors 42 are both connected to the precharge voltage for the input/output lines 21$_j$ and 21$_{j-}$, which in this case is V$_{cc}$. Input/output lines 21$_j$ and 21$_{j-}$ are also connected to one another by p-channel equilibration transistor 41. The gates of transistors 41 and 42 are connected to line IOEQ__, which is generated by timing control circuitry 22 responsive to an address transition detected by ATD circuit 26, or to such other events during the cycle for which equilibration of input/output lines 21 are desired.

On the read side of sense/write circuit 13$_j$, input/output lines 21$_j$ and 21$_{j-}$ are each connected to a p-channel pass transistor 43, each of pass transistors 43 having its gate controlled by an isolate signal ISO. Accordingly, input/output lines 21$_j$ and 21$_{j-}$ may be isolated from the read circuitry by line ISO at a high logic level, and may be connected thereto by line ISO at a low logic level. The complementary lines on the opposite side of pass transistors 43 from input/output lines 21$_j$ and 21$_{j-}$ are referred to in FIG. 5 as sense nodes SN and SN__, respectively.

Sense nodes SN and SN__ are also preferably precharged and equilibrated during the appropriate portion of the cycle, as sense amplifier 48 within sense/write circuit 13 operates in dynamic fashion, as will be described hereinbelow. P-channel precharge transistors 46 each have their source-to-drain paths connected between V$_{cc}$, and sense nodes SN and SN__, respectively. Equilibration transistor 45 is a p-channel transistor having its source-to-drain path connected between sense nodes SN and SN__. The gates of transistors 45 and 46 are all controlled by line SAEQ__ which, when at a low level, precharges and equilibrates sense nodes SN and SN__ in similar manner as described above relative to bit lines BL and BL__ and input/output lines 21$_j$ and 21$_{j-}$.

Sense amplifier 48 is a conventional CMOS latch consisting of cross-coupled inverters therewithin; the inputs and outputs of the cross-coupled latches are connected to sense nodes SN and SN__ in the conventional manner. N-channel pull-down transistor 47 has its source-to-drain path connected between the sources of the n-channel transistors in sense amplifier 48 and ground, and has its gate controlled by line SCLK.

Pull-down transistor 47 provides dynamic control of sense amplifier 48, so that the sensing of sense nodes SN and SN__ is performed in dynamic fashion. As is well known in dynamic RAMs, the dynamic sensing in this arrangement is controlled with transistor 47 initially off at the time that pass transistors 43 connect sense nodes SN and SN__ to input/output lines 21$_j$ and 21$_{j-}$; during this portion of the cycle, sense amplifier 48 is presented with a small differential voltage between sense nodes SN and SN__. After development of this small differential voltage, line SCLK is driven high, so that the sources of the pull-down transistors in sense amplifier 48 are pulled to ground. This causes sense amplifier 48 to develop a large differential signal on sense nodes SN and SN__, and latch the sensed state of sense nodes SN and SN__.

In this arrangement, sense nodes SN and SN__ are communicated to output bus 20 by way of R-S flip-flop 50; the set input of flip-flop 50 receives sense node SN__, and the reset input of flip-flop 50 receives sense node SN. The Q__ output of flip-flop 50 is connected, via inverter 49, to line 20: of output bus 20. Inverter 49 causes the logic state communicated to output bus 20 to be consistent with the polarity of bit lines BL and BL__ designated in this description. Inverter 49 preferably has a control input controlled by column decoder 18 (shown on line BLK of FIG. 5), so that inverter 49 is tri-stated when sub-array 12 with which sense/write circuit 13$_j$ is associated is not selected by column decoder 18.

It should be noted that other ones of sense/write circuit 13$_j$ are present in memory 1, and are associated with output bus line 20$_j$ in similar manner as sense/write circuit 13$_j$ of FIG. 5, but for different sub-arrays 12. All of sense/write circuits 13$_j$ associated with this line of output bus 20 are connected in wired-OR fashion. Accordingly, the control signals ISO, SAEQ__, and SCLK which are presented to the read side of sense/write circuit 13$_j$ are preferably, in this embodiment, generated by column decoder 18 in conjunction with timing control circuitry 22. Such generation of these control signals provides that the ones of sense/write circuit 13$_j$ associated with unselected ones of sub-arrays 12 are not enabled (by lines ISO maintained high, and lines SAEQ__ and SCLK maintained low) so as to maintain their sense nodes SN and SN__ equilibrated and precharged to V$_{cc}$, preventing bus conflict on output bus 20.

Looking now to the write side of sense/write circuit 13$_j$, line 38$_j$ from input bus 38, and write control signal WRSEL from column decoder 18, are received by the inputs to NAND gates 54T and 54C (with line 38$_j$ inverted by inverter 53 prior to its connection to NAND gate 54C). Write control signal WRSEL is generated according to the logical AND of selection of the sub-array 12 with which sense/write circuit 13$_j$ is associated, together with the appropriate timing signal from timing control circuitry 22 to effect the write operation at the appropriate time in the cycle, as is well known.

The output of NAND gate 54T controls the gate of a p-channel pull-up transistor 56T connected in push-pull fashion with an n-channel pull-down transistor 57T; the output of NAND gate 54T is also connected, via inverter 55T, to the gate of an n-channel pull-down transistor 57C which is connected in push-pull fashion with p-channel pull-up transistor 56C. Similarly, the output of NAND gate 54C is connected directly to the gate of pull-up transistor 56C, and is connected via inverter 55C to the gate of pull-down transistor 57T. The drains of transistors 56T and 57T drive input/output line $21_{j\_}$, and the drains of transistor 56C and 57C drive input/output line $21_{j\_}$.

Accordingly, the write side of sense/write circuit $13_j$ operates as a complementary pair of tri-state drivers. The drivers present a high-impedance state to input/output lines $21_j$ and $21_{j\_}$ responsive to write control line WRSEL being at a low logic level, as this places the outputs of both of NAND gates 54T and 54C at a high logic level, turning off all of transistors 56T, 56C, 57T, and 57C. Write control line WRSEL is, of course, at such a low logic level during read cycles, and during write cycles to sub-arrays 12 other than the one associated with sense/write circuit $13_j$.

According to this preferred embodiment, source followers are also provided on the write side of sense/write circuit $13_j$. N-channel transistor 60T has its source connected to input/output line $21_j$ and has its drain biased to Vcc; the gate of transistor 60T is controlled by the output of NAND gate 54C, inverted twice by inverters 55C and 59C. Similarly, n-channel transistor 60C has its source connected to input/output line $21_{j\_}$ and has its drain biased to Vcc; the gate of transistor 60T is controlled by the output of NAND gate 54T, inverted twice by inverters 55T and 59T.

The source followers of transistors 60T and 60C are provided in order to assist in the pull up of input/output lines $21_j$ and $21_{j\_}$ after a write operation and before a read operation (often referred to as "write recovery"). In operation, during a write operation, the one of input/output lines $21_j$ and $21_{j\_}$ that is driven to a low level by pull-down transistor 57 will also have its associated source follower transistor 60 off (due to the inversion from inverter 59); source follower transistor 60 will be on for the other input/output line which is driven high by its pull-up device 56. Upon write control line WRSEL returning to a low logic level at the end of the write operation, the outputs of both of NAND gates 54 will be high, and accordingly the transistor 60 which was not previously on will be turned on. This will pull up its associated input/output line $21_{j\_}$ from its prior low level toward the voltage $V_{cc}-V_t$ ($V_t$ being the threshold voltage of transistor 60). Precharge transistors 42, once turned on, will pull up input/output lines $21_j$ and $21_{j\_}$ fully to $V_{cc}$; once the voltages of input/output lines $21_j$ and $21_{j\_}$ reach a voltage above $V_{cc}-V_t$, transistors 60 will have no further effect.

It should be noted that both of source follower transistors 60 will remain on during read operations. Accordingly, input/output lines $21_j$ and $21_{j\_}$ are clamped so that their voltages cannot fall below the level of $V_{cc}-V_t$. However, it should be noted that $V_t$ in this embodiment is on the order of 1.25 volts. Since input/output lines 21 and bit lines BL and BL_ are precharged to $V_{cc}$, the selected memory cell 30 connected to bit lines BL and BL_ will thus create a differential voltage between input/output lines $21_j$ and $21_{j\_}$ on the order of $V_t$. This differential voltage can be easily sensed by sense amplifier 48. Therefore, the provision of source follower transistors 60 provide improved write recovery with little impact on the read operation.

Figure 6:
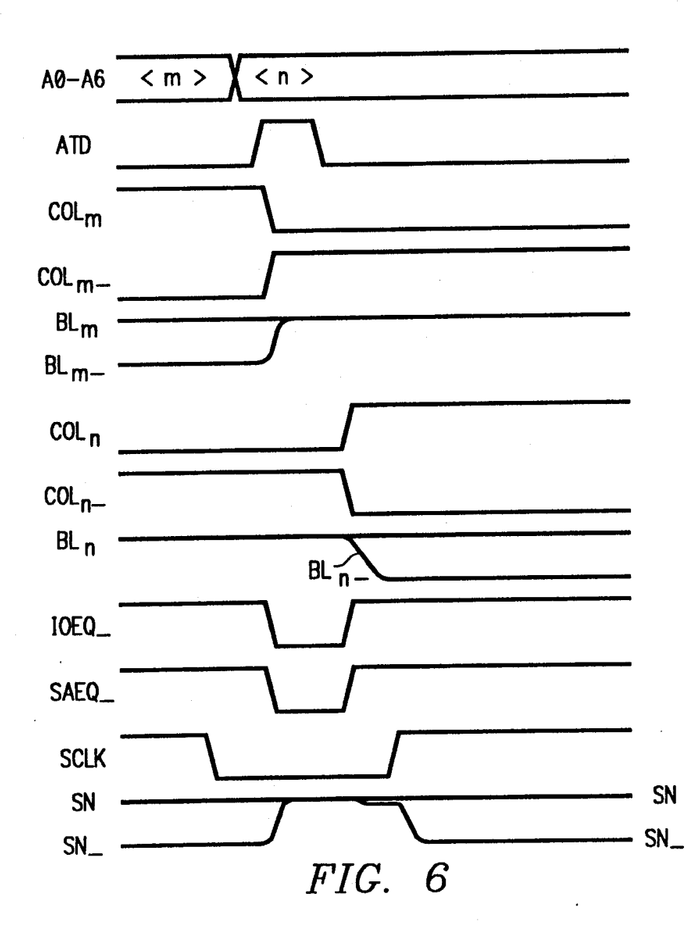
FIG. 6 is a timing diagram illustrating the operation of the memory according to the first embodiment of the invention.

Referring now to FIG. 6, the operation of memory 1 constructed as described hereinabove in performing read operations will now be described in detail. At the beginning of the sequence illustrated in FIG. 6, the value m is being presented to the column address terminals A0 through A6 of memory 1. Accordingly, for the columns in memory 1 associated with the column address value m (such columns numbering eight in this embodiment of the invention), line $COL_{m\_}$ is at a low logic level, turning on pass transistors $36p$ associated with column m; line $COL_m$ is also at a high logic level, turning off precharge and equilibrate transistors 32 and 34, and turning on pass transistors $36n$, associated with column m. Accordingly, the logic state stored in the memory cell 30 in column m and which is in the selected row presents its logic state as a differential signal on bit lines $BL_m$ and $BL_{m\_}$, as shown in FIG. 6 (as noted above, where source follower transistors 60 are used, this differential signal will be on the order of the threshold voltage of transistor 60).

Also during this time, lines IOEQ_ and SAEQ_ (as shown in FIG. 6) are all at a high logic level for the sense/write circuits 13 associated with the sub-array 12 in which selected columns m are located. For the sense/write circuits 13 which are associated with the selected sub-array 12, line ISO remains at a low logic level, so that each of input/output lines 21 are connected to sense nodes SN in an associated sense/write circuit 13. Preferably, after sense amplifier 48 has developed sufficient differential voltage between sense nodes SN and SN_, line ISO returns to a high logic level to reduce the load on sense amplifier 48 as line SCLK goes high. Accordingly, the logic state on bit lines $BL_m$ and $BL_{m\_}$ is communicated via input/output lines 21 to output bus 20, according to the circuitry illustrated in FIG. 5. It should be noted that line SCLK which controls the operation of sense amplifier 48 in the associated sense/write circuit 13 may return to a low level soon after sensing is accomplished, as the latching action of R-S flip-flop 50 in sense/write circuit 13 will maintain the proper data state at output bus 20.

It should be noted that, due to the column decoded equilibrate in memory 1 according to this embodiment, all columns other than those associated with column address m are in the precharge and equilibrate condition, i.e., their transistors 32 and 34 are turned on due to their COL line being driven to a low logic level by column decoder 18 via inverters 19. The unselected columns which are in precharge and equilibration include all columns which are not in the sub-array 12 in which selected columns m are located, and also includes the unselected columns in the same sub-array 12 in which selected columns m are located. Referring to FIG. 6, one such unselected column is illustrated by lines $COL_n$ and $COL_{n\_}$ being low and high, respectively, so that the bit lines associated therewith are precharged to $V_{cc}$ and equilibrated to one another. Accordingly in this embodiment, only eight columns (those associated with the selected column address value) are not in precharge and equilibration during an active cycle.

In the same sub-array 12 in which selected columns m are located, however, the one of row lines RL which is associated with the row address is activated. Accordingly, memory cells 30 are placed in communication with bit lines BL and BL__ not only for the selected columns m but also for the unselected columns in the selected sub-array 12. However, particularly in memory 1 having 1024 cells associated with each pair of bit lines BL and BL__, the capacitance of the bit lines is very large (on the order of 4 pF) relative to the drive of the memory cell. Due to this large capacitance, the AC load of bit lines BL and BL__ appears the same to memory cell 30 during precharge and equilibration as during selection. In the DC case, due to the use of p-channel precharge transistors 32, the high side of memory cell 30 in the selected row is not affected by precharge and equilibration. Therefore, it is believed that data retention and cell stability for the memory cells in unselected columns of the selected row in the selected sub-array 12 are not significantly affected by the column decoded equilibration according to the invention.

Upon transition of the address presented to address terminals A0 through A16, in this example with the new address including the value n for the column address portion, a pulse is issued on line ATD by address transition detection circuit 26. The pulse on line ATD causes column decoder 18 to drive all lines COL and COL__ to their off states (i.e., to low and high logic levels, respectively). Accordingly, line COL$_m$ associated with the most recently selected column is driven low, and line COL$_{m-}$ is driven high. As a result, bit lines BL$_m$ and BL$_{m-}$ are precharged to V$_{cc}$ via precharge transistors 32 turning on in their associated column, and are equilibrated via equilibration transistor 32 also turning on. It should be noted that lines COL and COL__ in previously unselected columns remain in their inactive states (i.e., low and high, respectively) during the pulse on line ATD.

As a result, the pulse on line ATD causes the control signals to all sense/write circuits 13 to initiate precharge and equilibration. With reference to FIG. 6, lines IOEQ__ and SAEQ__ are driven to a low logic level. Accordingly, input/output lines 21 and 21__ are precharged to V$_{cc}$, and equilibrated during the ATD pulse, as are sense nodes SN and SN__ in the read side of sense/write circuit 13, as shown in FIG. 6.

In the example of FIG. 6, the next address presented includes the column address value n, for selecting eight columns associated therewith; the operative signals associated with this column are illustrated in FIG. 6. Relative to column m, since it is no longer selected after the address transition, line COL$_m$ will remain low and line COL$_{m-}$ will remain high after the end of the pulse on line ATD.

At the end of the pulse on line ATD, and after the necessary time for decoding of the address value, line COL$_{n-}$ will be driven low by column decoder 18, and line COL$_{n-}$ will be driven high by column decoder 18 via inverter 19. In addition, the appropriate row line will also be activated to connect the memory cells 30 in the selected row to their associated bit lines BL and BL$_{13}$. Accordingly, bit lines BL$_n$ and BL$_{n-}$ associated with column n are driven differentially by the memory cell 30 in column n in the selected row. In contrast to the prior cycle, where bit lines BL$_n$ and BL$_{n-}$ were equilibrated so that memory cell 30 cannot present a differential signal, memory cell 30 in the selected row is able to present a differential signal on bit lines BL and BL__, since precharge transistors 32 and equilibration transistor 34 are off. This differential signal will be on the order of the threshold voltage of transistor 60, due to source follower transistors 60 in sense/write circuit 13$_j$.

Also responsive to the end of the pulse on line ATD, lines IOEQ__ and SAEQ__ are driven by column decoder 18 to a high level, thus allowing input/output lines 21 and 21__, and sense nodes SN and SN__, to respond to the differential signal on bit lines BL and BL$_{13}$. As shown in FIG. 6, this allows a differential signal to develop on sense nodes SN and SN__. At an appropriate time after development of this differential signal, line SCLK is driven high by column decoder 18 and timing control circuitry 22, so that sense amplifier 48 in sense/write circuit 13 develops a larger differential signal on sense nodes SN and SN__. This is communicated, as described hereinabove, via R-S flip-flop 50 and inverter 51 to output bus 20.

It should be noted that write operations may be performed in the manner described above relative to FIG. 5, with the timing of the column selection, precharge and equilibration, occurring in the same manner as in the read operation described relative to FIG. 6. It should be noted, however, that line ISO will be driven to a high logic level during write operations to turn off pass gates 43, so that data written by the write side of sense/write circuits 13 will not be sensed by sense amplifiers 48 and output onto output bus 20 during such operations.

The construction of memory 1 according to this embodiment of the invention, where the precharge and equilibration of bit lines is under the full control of the column decoder, based upon the value of the column address, provides significant benefits over prior architectures.

A first of these advantages is that the active current drawn for precharge and equilibration is much reduced, since only those columns which are selected in a cycle need be precharged and equilibrated. In the embodiment described hereinabove, only eight columns are precharged and equilibrated at the end of a cycle, rather than one hundred twenty-eight columns, as in the case of conventional architectures which release all columns in a sub-array or block. Even with the connection of the memory cells in the selected row of the unselected column to the bit lines, the equilibration device prevents a significant differential voltage from being established on the bit lines of the differential column. As a result, the precharge and equilibration transient which occurs at the end of a cycle, as the word lines are turned off, is quite low, as only the selected columns will have a significant differential voltage on their bit lines. This reduction in the number of columns having a significant differential voltage to be equilibrated allows for reduced drive circuitry necessary to drive the gates of the precharge and equilibration transistors (i.e., transistors 32 and 34 according to this example). In addition, the transients generated within memory 1 are much reduced, since the instantaneous current required to effect precharge and equilibration is significantly reduced.

Secondly, this embodiment of the invention provides advantages relative to the selected columns. Since unselected columns are actively precharged and equilibrated, there is no need for a static or other load on the bit lines to provide a pull-up for unselected columns which are not released. Accordingly, the bit lines BL and BL__ according to this invention which are associated with the selected columns float prior to enabling of the pass transistors 31 connecting the selected memory cell thereto. This allows the memory cell 30 to establish, in a read operation, a differential signal on floating bit lines BL and BL__ without opposing a pull-up or other DC load connected thereto; similarly, the write circuit can write to bit lines BL and BL__ without opposing a DC load, and thus without DC current flow. Such floating of the selected bit lines BL and BL__ is made possible by the controlling of precharge and equilibration of unselected bit lines according to the column address, which prohibits the unselected bit lines from floating.

In addition, it should be noted that the control of equilibration and precharge by the column decoder and the absence of bit line loads or pull-ups allows for effective and easy deselection of a column, for memories which include redundant columns available for replacing failing columns in the primary memory array. Referring to FIG. 4, it should be noted that the column can be disabled from communication to the remainder of the memory by opening single fuses 33, connected between the point at which bit lines BL and BL__ are connected to the first of memory cells 30, and the point at which bit lines BL and BL__ are connected to pass gates 36, precharge transistors 32 and equilibration transistor 34. With fuses 33 opened, as would be the case when the column is replaced by a redundant column, bit lines BL and BL__ are left fully floating. As a result, DC current cannot be drawn by this column if its failure is caused by a short circuit to either of the power supply nodes $V_{cc}$ or $V_{ss}$, or to some other biased lines. It should be noted that in prior memories, where the bit lines include pull-up loads on opposite ends from its connection to sense amplifiers and the remainder of the memory, such full disconnection of the bit lines would require the opening of two pair of fuses, rather than the single pair of fuses 33, as in this embodiment. Accordingly, this embodiment of the invention allows for the use of only a single pair of fuses to disconnect the bit lines in such a manner that no DC current can be drawn by the failing bit lines when replaced.

Figure 7:
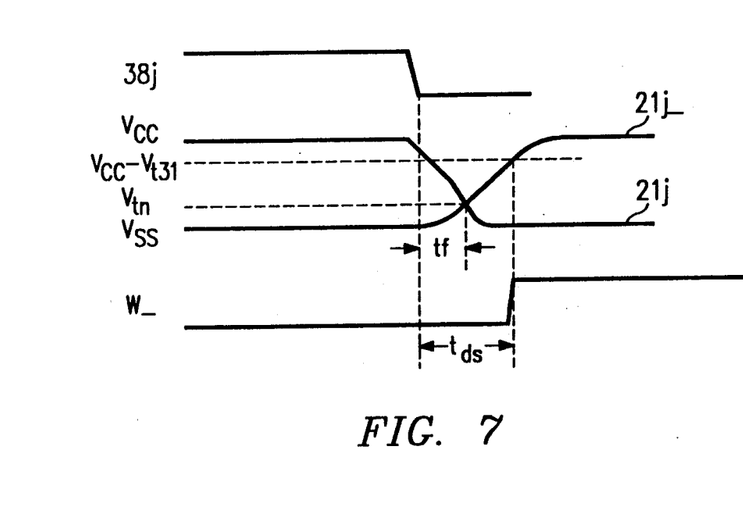
FIG. 7 is a timing diagram illustrating the effect of data change during a write operation.

Referring now to FIG. 7, the worst case write operation for memories such as memory 1 of FIG. 1 will now be described. As noted hereinabove for memory 1, and as also true for conventional memories which do not derive the bit line precharge and equilibration signal according to the column address, a sequence where the data state at a data input terminal changes during the write operation (such as occurs in successive writes of opposite data state to the same selected column) is the worst case condition for the parameter of data setup time (i.e., the time at which valid data must be presented prior to the end of the write enable pulse). FIG. 7 illustrates this worst case condition for a conventional memory.

In the example of FIG. 7, referring to the configuration of FIG. 5 for purposes of explanation, input bus line $38_j$ is at a high logic level at the beginning of the write cycle. Accordingly, by operation of the write side of sense/write circuitry 13 of FIG. 5, input/output lines $21_j$ and $21_{j\_}$ are high and low, respectively; input/output line $21_j$ is near $V_{cc}$, and input/output line $21_{j\_}$ is near $V_{ss}$. Also during this time, as shown in FIG. 7, write enable terminal W__ is at a low logic level, indicating that a write operation is to take place. As is conventional for static read/write memories such as memory 1, the input data can change during a write operation, with that data state which is valid at the data setup time (commonly referred to as $t_{ds}$) prior to the rising edge of the write enable signal W__ being the data state that is actually written into the selected memory cell.

In FIG. 7, a transition at the data input terminal occurs during the write cycle, such that input data bus line $38_j$ makes a high-to-low transition. In conventional memories, similarly as memory 1 described hereinabove, the write logic is static logic, so that as input line $38_j$ makes its transition, input/output lines $21_j$ and $21_{j\_}$ make a corresponding transition. However, due to the series parasitic resistance of the write side of sense/write circuitry 13, input/output lines $21_j$ and $21_{j\_}$, and bit lines BL and BL__ of the selected column which are connected thereto via pass transistors 36, the transition of input/output lines $21_j$ and $21_{j\_}$ responsive to the transition of input data bus line $38_j$ takes some amount of time as shown. Particularly, the low-to-high transition is slower than the high-to-low transition of input/output lines $21_j$ and $21_{j\_}$, due to the higher drive of n-channel transistors relative to p-channel transistors, and also possibly due to a difference in the parasitic loads for the two transistor types within sense/write circuit 13, as can result from the layout.

The selected memory cell 30, connected to the selected bit lines BL and BL__ driven by input/output lines $21_j$ and $21_{j\_}$, will change state at such time as the voltage on the falling one of bit lines BL and BL__ (in this case bit line BL, associated with input/output $21_j$) falls sufficiently low that the n-channel memory cell transistor connected thereto turns off. Referring to FIG. 7, this occurs at time $t_f$ after the transition of input data bus line $38_j$, when input/output line $21_j$ falls below the voltage $V_{tn}$, the threshold voltage of the n-channel memory cell transistor.

However, if the write operation were to stop at approximately time $t_f$, the state that would be written into the selected memory cell 30 would have poor stability. It is well known that, in static RAMS, particularly those with polysilicon load resistors, the stability of the memory cell increases with the voltage on the higher one of the bit lines BL and BL__ written into the cell. In the arrangement of FIG. 4, where n-channel pass transistors 31 are used, the highest voltage that can be written into a memory cell, assuming that row lines RL are not bootstrapped to a voltage above $V_{cc}$, is the value $V_{cc}$-$V_{t31}$ ($V_{t31}$ being the threshold voltage of n-channel pass transistors 31). Referring to FIG. 7, the time at which input/output line $21_{j\_}$ reaches this level, providing the highest usable voltage to bit line BL of the selected column, is identified as $t_{ds}$; the most stable voltage is thus written into the selected memory cell 30 so long as write enable terminal W__ does not make its transition until this time.

As is evident from FIG. 7, the parasitic series resistance of the write path (including input/output lines $21_j$ and $21_{j\_}$, and bit lines BL and BL__) thus directly affects the data setup time specification $t_{ds}$. It should also be noted that the this specified time is generally the limiting factor in defining the write cycle time for the static RAM. Accordingly, the parasitic series resistance of the write path directly affects the speed at which data can be written into the memory.

Figure 8:
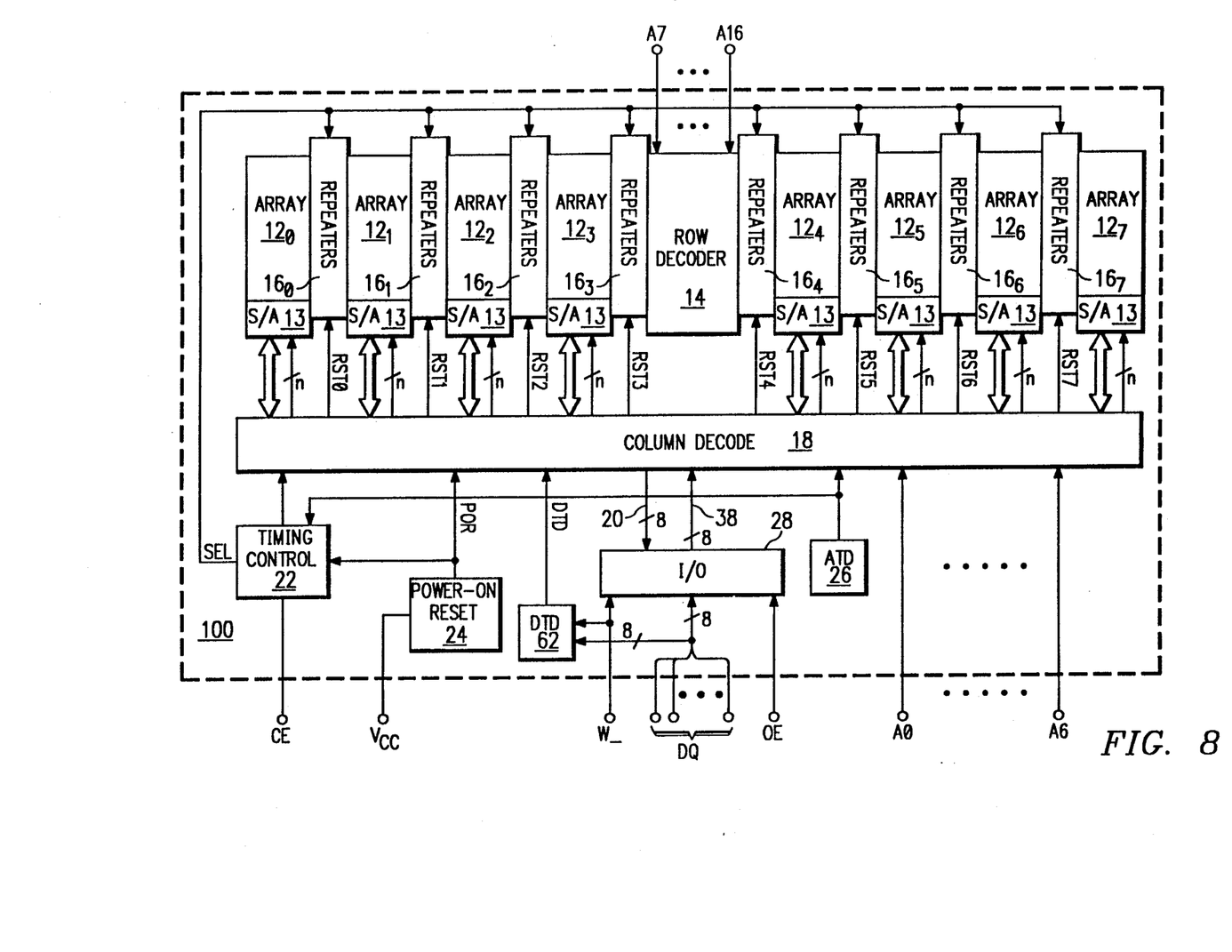
FIG. 8 is an electrical diagram, in block form, of a memory according to a second embodiment of the invention.

Referring now to FIG. 8, memory 100 according to a second embodiment of the invention, including circuitry for improving the data setup time $t_{ds}$, is shown in block form. Memory 100 according to this embodiment is similar to memory 1 of FIG. 1, with like elements thereof indicated by the same reference numerals. It should be noted that the improvement in memory 100 over memory 1 may also be implemented in, and is beneficial to, conventional memories which do not utilize the column decoded equilibrate described hereinabove. Such conventional memories include those which, for example, generate bit line precharge and equilibration for all columns in the memory at the end of a cycle, and use time-out or bit line loads to keep unselected bit lines from floating. Accordingly, it is believed that the combination of the column decoded bit line equilibrate together with the circuitry for improving the data setup time provides the benefits of both, as will be described hereinbelow.

Referring to FIG. 8, in addition to address transition detection circuit 26, memory 100 includes data transition detection (DTD) circuit 62. DTD circuit 62 has inputs connected to each of the input/output terminals DQ, and has a control input connected to the write enable terminal W__. The output of DTD circuit 62 is communicated to column decoder 18, as will be shown hereinbelow. DTD circuit 62 is constructed similarly as ATD circuit 26, and provides a pulse at its output on line DTD responsive to detection of a transition at any of input/output terminals DQ during a write operation (indicated to DTD circuit 62 by terminal W__). As will be described in further detail hereinbelow, the detection of data transition during a write operation will be used to control the precharge and equilibration of bit lines BL and BL__ in the selected columns.

Figure 9:
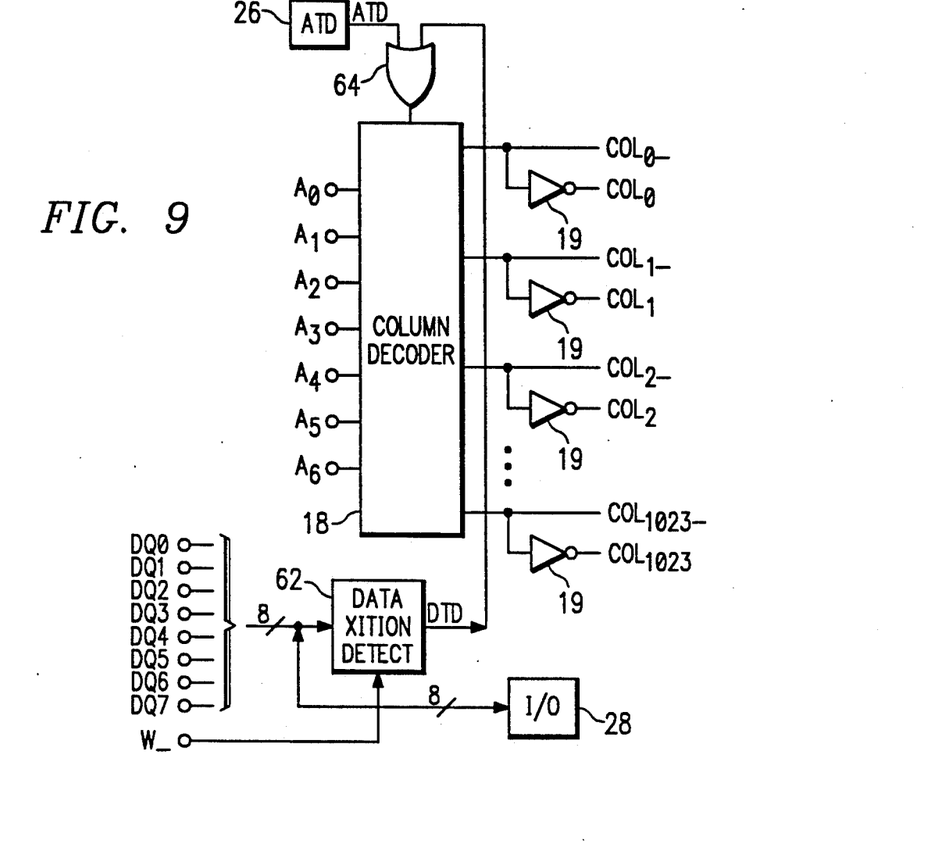
FIG. 9 is an electrical diagram, in schematic form, of the output of the column decoder in the memory of FIG. 8.

Referring now to FIG. 9, control of column precharge and equilibration responsive to the data transition signal on line DTD from DTD circuit 62 will now be described. As in the embodiment described hereinabove relative to FIG. 3, column decoder 18 generates column select signals $COL_0$__ through $COL_{1023}$__ responsive to the value of the column address received at terminals A0 through A6; in addition, ATD circuit 26 provides a control input to column decoder 18 so that, as described hereinabove, all column select lines COL__ are disabled (i.e., at high logic levels) responsive to detection of an address transition.

FIG. 9 illustrates that DTD circuit 62 receives inputs from each of input/output terminals DQ (which are also connected to input/output circuitry 28), and a control input from write enable terminal W__. As indicated hereinabove, DTD circuit 62 will issue a logic high level pulse on line DTD responsive to a transition at any one of input/output terminals DQ during such time as write enable terminal W__ is low. Line DTD at the output of DTD circuit 62 is connected to an input of an OR gate 64; the other input of OR gate 64 receives line ATD from ATD circuit 26. The output of OR gate 64 controls, in this embodiment, column decoder so that in the event of either an address transition, or a data transition during a write operation, all 1024 columns are unselected.

As a result, bit lines BL and BL__ of the selected column in the selected sub-array 12 will be precharged and equilibrated responsive to a data transition occurring during a write operation. It should be noted that the pulse width on line DTD generated responsive to a data transition is preferably shorter than that on line ATD generated responsive to an address transition, as the bit line precharge and equilibration of the selected columns in the write operation can be done more quickly than the entire set of operations which may occur responsive to an address transition.

It should be noted that the construction of a column in memory 100 according to this embodiment of the invention may be the same as that described hereinabove relative to FIG. 4. In addition, it should be noted that, in this embodiment of the invention, the construction of sense/write circuits 13 of memory 100 is preferably the same as that in memory 1, and as described hereinabove relative to FIG. 5.

As a result of the construction of the columns in memory 100 as shown in FIGS. 8 and 9, precharge transistors 32 and equilibration transistor 34 in the previously selected column will be turned on by line $COL_n$ going low responsive to detection of a transition at any of input/output terminals DQ. Accordingly, precharge transistors 32 will serve to pull bit lines BL and BL__ and input/output lines $21_j$ and $21_{j-}$ toward $V_{cc}$ for the duration of the pulse on line DTD. This will serve to speed up the point in time at which the rising bit line will reach the voltage $V_{cc}-V_t$, as will now be described relative to the timing diagram of FIG. 10.

Figure 10:
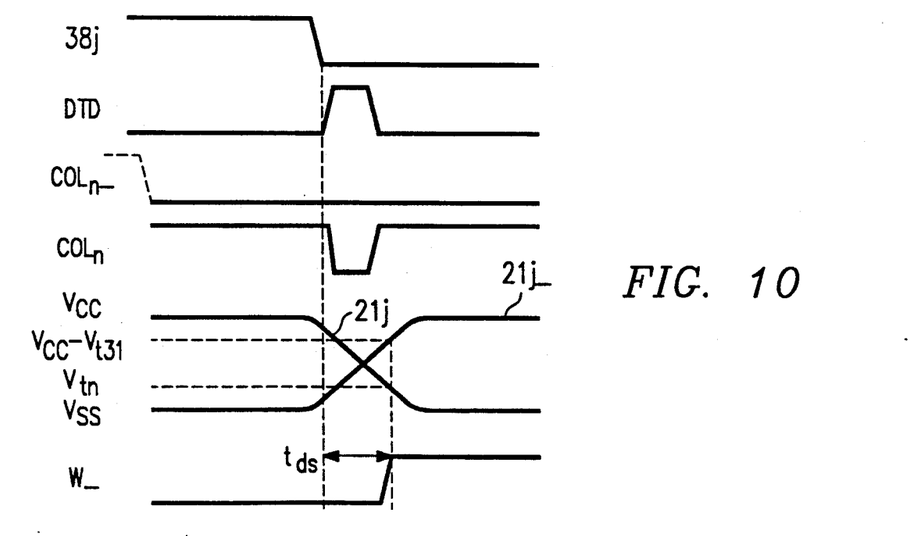
FIG. 10 is a timing diagram illustrating the operation of the memory according to the second embodiment of the invention.

In FIG. 10, the illustrated write cycle (with write enable terminal W__ having a low logic level) begins with input bus line $38_j$ having been at a high logic level for some time, with line DTD thus at a low logic level. For the selected column n, line $COL_{n-}$ is at a low logic level and line $COL_n$ is at a high logic level. Accordingly, bit lines BL and BL__ for the selected columns are connected to the input/output lines $21_j$ and $21_{j-}$ associated therewith. Due to the state of input bus line $38_j$, input/output line $21_j$ is at a high logic level near $V_{cc}$, and input/output line $21_{j-}$ is at a low logic level near $V_{ss}$; with line $COL_{n-}$ low and line $COL_n$ high, the state of input/output lines $21_j$ and $21_{j-}$ are communicated to bit lines BL and BL through pass transistors $36n$ and $36p$.

Input data bus line $38_j$ next makes a high-to-low transition responsive to the transition at its associated input/output terminal DQ. As described hereinabove, DTD circuit 62 issues a pulse on line DTD responsive to this transition, as shown in FIG. 11, which will be communicated to column decoder 18 by OR gate 64. Responsive to the pulse on line DTD, all lines $COL_n$ are pulled low by column decoder 18, since column decoder 18 selects no columns responsive to a pulse on either line ATD or line DTD. This causes precharge transistors 32 and equilibration transistor 34 to be turned on for the selected column. Bit lines BL and BL__ are thus both pulled toward $V_{cc}$ through transistors 32, and at the end of the short DTD pulse, are connected again to input/output lines $21_j$ and $21_{j-}$ by pass gates 36 for the selected column (since the column address value did not change). It should be noted that the other equilibration operations in memory 1 (such as, for example, equilibration of input/output lines $21_j$ by transistors 42 under the control of line IOEQ__) are preferably not enabled as a result of the data transition, but remain under the control of column decoder 18, timing and control circuitry 22 and the address transition detection circuit 26 in the manner described hereinabove. It should also be noted that the duration of the equilibration enabled by a data transition during a write operation may be much shorter (e.g., on the order of 7 nsec) than the full bit line equilibration enabled by an address transition at the end of a cycle (e.g., on the order of 16 nsec). This is because significant benefit results from merely driving the bit lines BL and BL__ toward the same voltage by equilibration as a result of a write operation data transition; full equilibration is preferred at the end of a cycle, however, since the next operation may be a read, which requires that the differential bit line voltage be as low as possible. Providing a short equilibration upon a write cycle data transition also may be done within the short period of time allowed for a write operation (e.g., equilibration of 7 nsec may be done within a 25 nsec write operation) while a full equilibration would slow the write operation and likely not be possible within the specified data setup time.

The effects of pulling up bit lines BL and BL_ may be seen relative to input/output lines $21_j$ and $21_{j\_}$ as shown in FIG. 10. The pulling up of bit lines BL and BL_ assists the rising one of input/output lines $21_j$ and $21_{j\_}$, which in the example of FIG. 10 is input/output line $21_{j\_}$. It should also be noted that equilibration transistor 34, since it can be placed closer to bit lines BL and BL than, for example, write drivers 56 or equilibration transistor 41 in sense/write circuit 13, can also provide efficient precharge, due to the reduced parasitic load resulting from its close placement. Therefore, the time required for the rising input/output line $21_{j\_}$ to the level $V_{cc}-V_{t31}$ after the transition of input data bus line $38_j$ (this time corresponds to data setup time $t_{ds}$) is reduced from that in the example of FIG. 7 described hereinabove. This allows for memory 100 to successfully operate with a reduced data setup time specification, relative to a similar memory not including control from data transition detection as in this embodiment of the invention.

It is of course noted that this pulling up of bit lines BL and BL_ will be in opposition to the high-to-low transition of input/output line $21_j$ (in this example). Accordingly, the time at which input/output line $21_j$ reaches the voltage $V_{tn}$ after the transition of input data bus line $38_j$ is delayed from that of the example of FIG. 7. As noted above, discharging of the floating input/output line is generally accomplished earlier than pulling the same high, due to the increased drive capability generally available for n-channel transistors (such as transistors 57T and 57C) as compared with p-channel transistors (such as transistors 56T and 56C, and also as compared with precharge transistors 32). Accordingly, while the precharging of bit lines BL and BL_ according to this embodiment of the invention will slow down the high-to-low transition, the extent to which this transition is slowed can be limited, by way of rudimentary simulation and design choice, to occur at approximately the same time as the low-to-high transition is complete. For example, the duration of the DTD pulse can be designed in order to optimize the length of time that the input/output lines 21 are pulled up to assist the low-to-high transition without unduly slowing the high-to-low transition.

It should be noted that the input data for some or all of the other selected columns may not be making a transition at the time that input data bus line $38_j$ is making a transition. The lines COL will precharge the bit lines BL and BL_ associated with these columns as well. Since no transition is occurring on the input/output lines 21 for these columns, the sole effect of the precharging operation will be to slightly pull up the low one of the input/output lines 21. It is contemplated that, upon completion of the pulse on line COL, the extent to which the low input/output line is pulled up will be quickly overcome by the operation of the write side of sense/write circuitry 13.

It should be noted that many alternatives for assisting the data transition for selected columns exist which take advantage of the invention. For instance, the precharging of the bit lines may be to a midlevel voltage such as $V_{cc}/2$, for which the effects of the precharging and equilibration in response to the data transition will tend to assist both transitions of input/output lines 21, albeit to a lesser degree, due to the reduced voltage differential between the input/output lines 21 and such a midlevel voltage. It is contemplated that other alternatives will now be apparent to those of ordinary skill in the art having reference to this specification and its drawings.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

I claim:

1. A memory in an integrated circuit, comprising:
   an array of memory cells arranged in rows and columns;
   a plurality of pairs of bit lines, each pair associated with one of said columns, for communicating a differential signal;
   a plurality of precharge transistors, each precharge transistor associated with one of said bit lines, each of said precharge transistors having a conduction path connected between its associated bit line and a precharge voltage, and having a control terminal;
   a first input terminal for receiving input data;
   a write circuit coupled between said first input terminal and said array, for communicating input data to the bit lines of a selected column during a write operation;
   a write enable terminal for receiving a write enable signal enabling a write operation;
   a data transition detection circuit, having a first input coupled to said first input terminal, for detecting a transition of the input data at the first input terminal; and
   means for controlling the control terminals of said precharge transistors responsive to said data transition detection circuit in such a manner that the precharge transistors of said selected column are conductive responsive to a transition of the input data occurring during receipt of the write enable signal at said write enable terminal for a period of time prior to said write circuit communicating, to the bit lines of the selected column, input data corresponding to the input data received at said first input terminal after said transition.

2. The memory of claim 1, further comprising:
   a plurality of equilibration transistors, each associated with a pair of bit lines, having a conduction path connected between its associated bit lines, and having a control terminal;
   wherein said controlling means is also for controlling the control terminal of said equilibration transistors responsive to said detecting means, in such a manner that each of said equilibration transistors is conductive responsive to a transition of the input data.

3. The memory of claim 1, further comprising a second input terminal for receiving input data.

4. The memory of claim 3, wherein said
   data transition detection circuit has a second input coupled to said second input terminal, for detecting transitions of input data at said second input terminal.

5. The memory of claim 1, wherein said controlling means comprises:
a column decoder, having a plurality of outputs for selecting a column in said array, responsive to a column address presented thereto, and having a control input, wherein each of the plurality of outputs of said column decoder is coupled to the control terminal of one of the precharge transistors; and
precharge control circuitry, having an input for receiving a signal from said detecting means, and having an output coupled to said control input of said column decoder so that, responsive to said detecting means detecting a transition of the input data, said column decoder causes the precharge transistors of said selected column to be conductive.

6. The memory of claim 5, wherein the outputs of said column decoder causes the precharge transistors of columns which are not selected by said column decoder to be conductive.

7. The memory of claim 5, further comprising:
address terminals, for receiving an address signal; and
an address transition detection circuit for detecting a transition at said address terminals, having inputs coupled to said address terminals and its output coupled to said precharge control circuitry;
wherein said precharge control circuitry presents a signal to the control input of said column decoder to cause said precharge transistors to be conductive responsive also to said address transition detection circuit detecting a transition.

8. A memory in an integrated circuit, comprising:
an array of memory cells arranged in rows and columns;
a plurality of pairs of bit lines, each pair associated with one of said columns, for communicating a differential signal;
a plurality of precharge transistors, each precharge transistor associated with one of said bit lines, each of said precharge transistors having a conduction path connected between its associated bit line and a precharge voltage, and having a control terminal;
means for receiving input data;
a write circuit coupled between said receiving means and said array, for communicating input data to the bit lines of a selected column during a write operation;
a write enable terminal for receiving a write enable signal indicating that a write operation is to be performed;
means for detecting a transition of the input data received by said receiving means; and
means for controlling the control terminals of said precharge transistors responsive to said detecting means, in such a manner that the precharge transistors of said selected column are conductive responsive to a transition of the input data occurring in combination with said write enable signal, comprising:
a column decoder, having a plurality of outputs for selecting a column in said array, responsive to a column address presented thereto, and having a control input, wherein each of the plurality of outputs of the column decoder is coupled to the control terminal of one of said precharge transistors; and
precharge control circuitry, having an input for receiving a signal from said detecting means, and having an output coupled to the control input of said column decoder so that, responsive to said detecting means detecting a transition of the input data, said column decoder causes the precharge transistors of the selected column to be conductive;
address terminals, for receiving an address signal; and
an address transition detection circuit for detecting a transition at said address terminals, having inputs coupled to said address terminals and its output coupled to said precharge control circuitry;
wherein said precharge control circuitry presents a signal to the control input of said column decoder to cause said precharge transistors to be conductive responsive also to said address transition detection circuit detecting a transition;
and wherein said address transition detection circuit has an output coupled to said column decoder, so that, responsive to a transition at said address terminals, all of said precharge transistors are conductive.

9. The memory of claim 8, wherein said write circuit is connected to input/output lines for communication of data to said array;
and further comprising:
input/output precharge transistors, each transistor having a conduction path connected between an associated input/output line and a precharge voltage, and having a control terminal; and
timing control circuitry, having an output coupled to sad control terminal of said input/output precharge transistors, and having an input coupled to said address transition detection circuit, so that said input/output precharge transistors are conductive responsive to a transition at said address terminals.

10. A method for operating a memory in an integrated circuit, said memory comprising a plurality of memory cells arranged in rows and columns, each of said columns associated with a pair of bit lines for communication of a differential signal thereupon, said method comprising the steps of:
selecting a column of said memory responsive to a column address;
receiving a first logic state of input data at a data input terminal;
receiving a write enable signal enabling a write operation;
during receipt of the write enable signal, receiving a second logic state of input data at said data input terminal;
responsive to receiving said second logic state of input data in combination with said write enable signal, coupling the bit lines associated with said selected column to a precharge voltage; and
then placing, onto the bit lines of the selected column, a data state corresponding to said second logic state of input data received at said data input terminal.

11. The method of claim 10, wherein said write enable signal is a pulse.

12. The method of claim 11, wherein said coupling step is performed responsive to receiving said second logic state of input data prior to the end of said write enable signal pulse.

13. The method of claim 10, wherein said memory further includes a write circuit coupled between said input data terminal and an input/output bus;

and further comprising:
responsive to receiving a new address signal, coupling lines in said input/output bus to a precharge voltage.

14. The method of claim 13, further comprising:
coupling the bit lines of said selected column to said input/output bus.

15. The method of claim 14, further comprising:
coupling the bit lines of unselected ones of said columns to said precharge voltage.

16. The method of claim 11, further comprising:
also responsive to receiving said second logic state of input data in combination with said write enable signal, coupling the bit lines associated with said selected column to one another.

17. The method of claim 10, wherein said write enable signal is a pulse;
wherein said coupling step is performed responsive to receiving said second logic state of input data prior to the end of said write enable signal pulse.

18. The method of claim 17, wherein said placing step is performed responsive to the end of said write enable signal.

* * * * *